United States Patent [19]

Rinderle

[11] 4,055,822
[45] Oct. 25, 1977

[54] TUNING CIRCUIT ARRANGEMENT

[75] Inventor: Heinz Rinderle, Heilbronn, Germany

[73] Assignee: Licentia Patent-Verwaltungs-G.m.b.H., Frankfurt am Main, Germany

[21] Appl. No.: 691,024

[22] Filed: May 28, 1976

[30] Foreign Application Priority Data

May 31, 1975 Germany .............................. 2524171

[51] Int. Cl.² .............................................. H03J 3/18
[52] U.S. Cl. .................................... 334/15; 331/177 V
[58] Field of Search ...................... 334/15; 331/177 V

[56] References Cited

U.S. PATENT DOCUMENTS

| 3,354,397 | 11/1967 | Wittig | 334/15 X |
| 3,517,352 | 6/1970 | Marshall et al. | 334/15 |
| 3,755,763 | 8/1973 | Hoshi | 334/15 X |
| 3,801,915 | 4/1974 | Ostuni et al. | 334/15 X |

Primary Examiner—Paul L. Gensler
Attorney, Agent, or Firm—Spencer & Kaye

[57] ABSTRACT

A tuning circuit arrangement comprises one or more tuned circuits whose frequency range is tuned by tuning diodes, means being provided for varying the tuning voltage of the tuning diodes to provide exclusive variation of the tuned circuit capacitance of the tuned circuit.

5 Claims, 8 Drawing Figures

TUNING CIRCUIT ARRANGEMENT

BACKGROUND OF THE INVENTION

The invention relates to a tuning circuit arrangement comprising one or more tuning circuits in which tuning diodes are provided for tuning of the frequency range. In such an arrangement, the adjustment of the tuned circuit takes place, for example, by changing the tuned circuit inductance and the tuned circuit capacitance.

As is known, tuning circuits have the object of tuning the resonant circuits of selective amplifiers and/or oscillators to a given resonant frequency. In a known tuning circuit, the adjustment to synchronous operation in each circuit takes place via a tuning coil and a particular trimmer capacitor. In the known tuning circuit arrangement a multiply repeated adjustment of the inductance and the capacitance is required for adjustment to synchronous operation, because the setting of the trimmer capacitors again changes the resonant frequency of the frequency previously set inductively.

SUMMARY OF THE INVENTION

It is an object of the invention to provide a tuning circuit arrangement with simplified adjustment.

According to a first aspect of the invention, there is provided a tuning circuit arrangement comprising one or more tuned circuits, tuning diodes in said tuned circuits for tuning the frequency range of said tuned circuits and means for varying the tuning voltage of said tuning diodes for providing exclusive variation of the tuned circuit capacitance of said tuned circuit.

According to a second aspect of the invention, there is provided a tuning circuit arrangement comprising one or more tuning circuits, in which tuning diodes are provided for the purpose of tuning the frequency range and in which the tuned circuit adjustment takes place by changing the tuned circuit inductance and the tuned circuit capacitance, characterized in that the adjustment in capacitance takes place exclusively by varying the tuning voltage for the tuning diode(s).

BRIEF DESCRIPTION OF THE DRAWINGS

The invention will now be described in greater detail, by way of example, with reference to the drawings in which.

DESCRIPTION OF THE PREFERRED EMBODIMENTS

In a tuning circuit arrangement of the type mentioned at the beginning it is proposed in accordance with the invention and in order to solve the object that the adjustment in capacitance should take place exclusively by variation of the tuning voltage for the tuning diode(s).

The essence of the invention on the one hand consists in that special trimmer capacitors for achieving an adjustment in capacitance are omitted and that the adjustment in capacitance takes place exclusively by variations of the tuning voltage for the tuning diode(s) which is in contrast to the known method, and does not take place by means of trimmer capacitors. On the other hand, the invention does not require any repetitive adjustment of the tuned circuits of the tuning circuits.

The tuning circuit arrangement in accordance with the invention makes it possible to reduce considerably the required maximum tuning voltage. With the tuning circuit arrangement in accordance with the invention it is possible to operate with small tuning voltages even when using tuning diodes having abrupt pn junction. The sought after simplification of the adjustment can be achieved by means of the fact that the capacitative adjustment does not influence the previously operated adjustment in inductance.

In the tuning circuit arrangement according to the invention potentiometers, for example, are provided in order to adjust the capacitance. There is the possibility of using the same adjusting means for adjusting the capacitance of two or more tuned circuits. Similarly, the same adjustment means may serve to adjust the capacitance of several tuned circuits having varying relative frequency variation.

In accordance with a further refinement of the invention a circuit arrangement for producing minimum and maximum tuning potentials is provided which is constructed so that the potentials produced by it have such a temperature dependence that the effect of temperature on the tuning circuit is compensated.

It is advisable to connect a decoupling circuit between the means for adjusting capacitance and the tuning potentiometers, the decoupling circuit reducing the electrical load on the tuning potentiometer through the adjustment means. In accordance with an embodiment of the invention, precautions are taken to ensure that one of the two potentials applied to an adjustment potentiometer, does not change during adjustment.

The adjustment potentiometer or potentiometers are connected for example between a point in the circuit at which the variable tuning potential is available and a point in the circuit at which the minimum tuning potential is available. There is also the possibility of connecting the adjustment potentiometer or potentiometers between a point in the circuit at which the variable tuning potential is available and a point in the circuit at which the maximum tuning potential is available.

Figure 1:
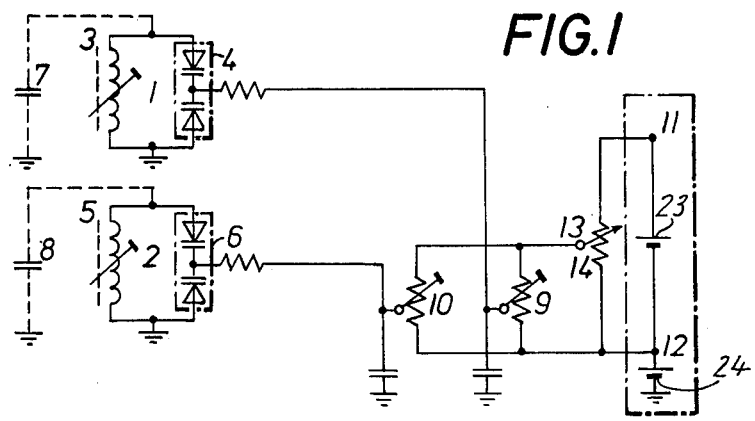
FIG. 1 is a circuit diagram showing a first form of circuit arrangement in accordance with the invention as applied to two resonant circuits.

Referring now to the drawings, FIG. 1 shows an electronic tuning circuit in accordance with the invention which operates with tuning diodes. The tuning circuit of FIG. 1, which is for example a component of a VHF tuner, consists of two variable-frequency resonant circuits and in fact an oscillator circuit 1 and a resonant circuit 2 for selecting the input signal. The oscillator circuit comprises an inductance 3 and a tuning diode 4, which is a double diode in this embodiment.

The resonant circuit 2 comprises an inductance 5 and a tuning diode 6, which in this embodiment is also a double diode. As may be seen from FIG. 1, neither of the two resonant circuits 1 and 2 has a trimmer capacitor. Of course, parallel to the resonant circuits there are unavoidable circuit capacitances 7 and 8 which are shown in broken lines.

The two resonant circuits 1 and 2 must be adjusted to achieve synchronous operation. In accordance with the invention the adjustment potentiometers 9 and 10 are provided for this purpose. The adjustment potentiometers 9 and 10 are connected in parallel with one another in the embodiment of FIG. 1. Two limiting potentials are required for the tuning circuit; in fact the largest potential $U_{max}$ at point 11 and the smallest potential $U_{min}$ at point 12. In the embodiment of FIG. 1 the two adjustment potentiometers 9 and 10 lie between the wiper contact 13 of the tuning potentiometer 14 and the point 12 having the potential $U_{min}$. The tuning potentiometer 14 lies between the points 11 and 12, i.e. between the maximum potential $U_{max}$ and the minimum potential $U_{min}$. The maximum tuning potential $U_{max}$ and the minimum tuning potential $U_{min}$ are in fact linked together, yet they are produced in a separate circuit arrangement. This is indicated symbolically in FIG. 1 by means of the two voltage sources 23 and 24. The minimum tuning potential $U_{min}$ is therefore not derived via a purely ohmic voltage divider from the maximum tuning potential $U_{max}$.

In the tuning circuit of FIG. 1, in the case where the tuning potentiometer 14 is set to the minimum tuning voltage, the voltages taken from the adjustment potentiometers 9 and 10 are not influenced by the settings of the adjustment potentiometer. Therefore, if the wiper contact 13 of the tuning potentiometer 14 is located at the lowest position then no matter how the adjustment potentiometers 9 and 10 are rotated the adjustment voltages for the tuning diodes will not be influenced by this. This has the consequence that setting in the upper frequency range has no influence on the previously set lower frequency. The adjustment of the lower frequency is only dependent on the inductance adjustment of the inductances 3 and 5.

Figure 2:
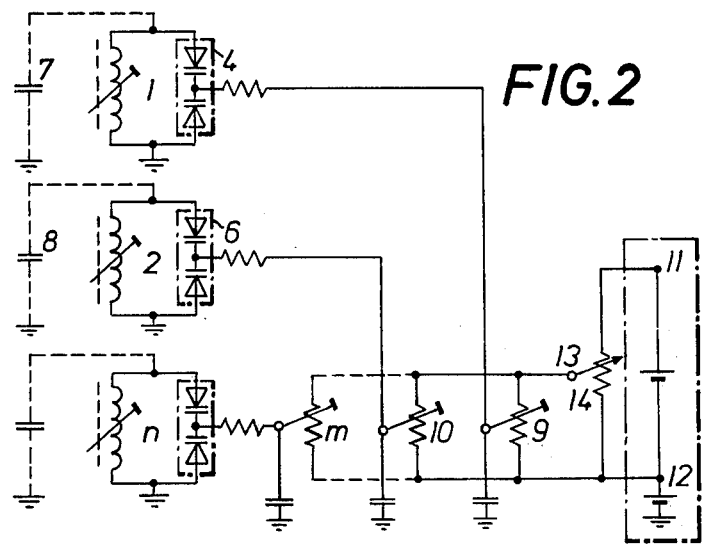
FIG. 2 is a circuit diagram similar to FIG. 1 but showing the arrangement applied to $n$ resonant circuits.

The tuning circuit of FIG. 2 is distinguished from the tuning circuit of FIG. 1 by the fact that instead of only two resonant circuits $n$ resonant circuits are provided and, instead of only two adjustment potentiometers, $m$ adjustment potentiometers are provided. $m$ may be smaller than $n$ if not merely one resonant circuit but more than one resonant circuit is adjusted by means of a single adjustment potentiometer.

Figure 3:
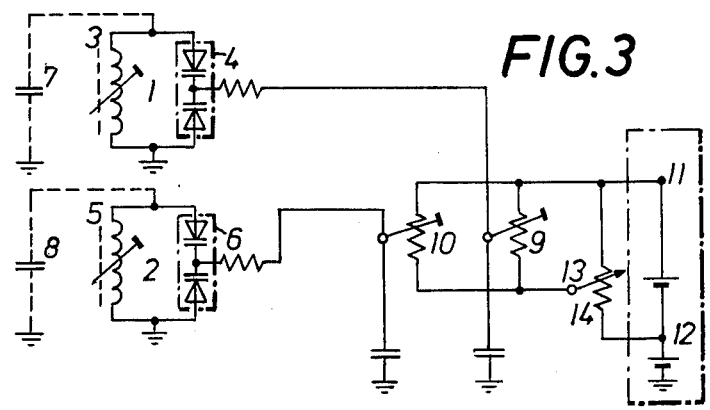
FIG. 3 is a circuit diagram similar to FIG. 1 but showing the arrangement with a different form of adjustment.

FIG. 3 shows an embodiment of the invention in which in contrast to FIGS. 1 and 2 the adjustment potentiometers 9 and 10 lie between the wiper contact 13 of the tuning potentiometer 14 and point 11 having the potential $U_{max}$. In this case, the adjustment in inductance takes place in the upper frequency and the adjustment in capacitance takes place in the lower frequency by means of the adjustment potentiometers 9 and 10.

Figure 4:
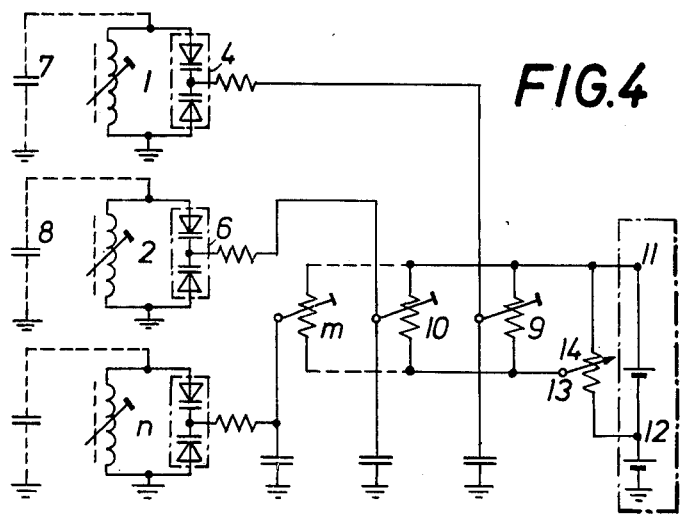
FIG. 4 is a circuit diagram similar to FIG. 2 in which the arrangement of FIG. 3 is applied to $n$ resonant circuits.

The tuning circuit of FIG. 4 is distinguished from the tuning circuit of FIG. 3 by the fact that, instead of only two resonant circuits, again $n$ resonant circuits are provided and instead of only two adjustment potentiometers $m$ adjustment potentiometers are provided.

Figure 5:
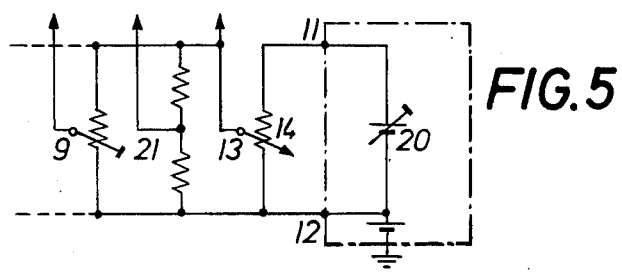
FIG. 5 is a circuit diagram showing a part of the arrangement showing a different form of adjusting circuitry.

According to FIG. 5 the adjustment in capacitance is undertaken for the upper frequency by setting the maximum tuning potential. While in the tuning circuits of FIGS. 1 to 4 the adjustment of the individual tuned circuits is independent, in the arrangement of FIG. 5 the setting of the maximum tuning potential effects all tuned circuits. The setting of the maximum tuning potential takes place in the arrangement of FIG. 5 by means of the voltage source 20. The voltage supplying the tuning diodes may for example be taken from the wiper contact 13 of the tuning potentiometer 14, from a fixed voltage divider 21 or from the wiper contact of the adjustment potentiometer 9. Several adjustment potentiometers may be provided instead of only one adjustment potentiometer.

Figure 6:
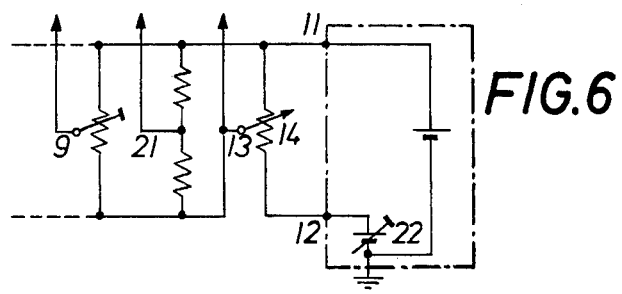
FIG. 6 is a circuit diagram similar to FIG. 5 but showing a still further form of adjusting circuitry.

The arrangement of FIG. 6 is distinguished from the arrangement of FIG. 5 by the fact that the minimum tuning potential is made settable instead of the maximum tuning potential for the purpose of adjustment. Moreover, in the arrangement of FIG. 6, the network which comprises the voltage divider 21 and the adjustment potentiometer 9, is connected between the wiper contact 13 of the adjustment potentiometer 14 and the maximum tuning potential 11.

Figure 7:
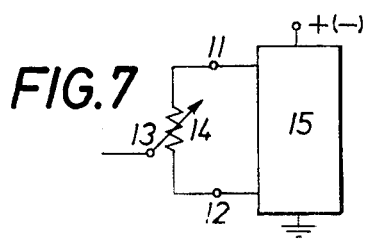
FIG. 7 is a block diagram of part of the arrangement provided with temperature compensation and, FIG. 8 is a block diagram similar to FIG. 7 but including a decoupling circuit.

According to FIG. 7, the maximum and minimum tuning potential is produced by means of a circuit arrangement 15 which has the object of supplying such a temperature effect of the potential that the temperature effect of the tuning circuit is compensated by an appropriate temperature effect of the potentials.

Figure 8:
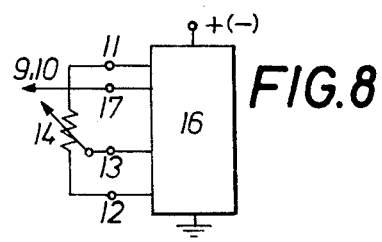

The arrangement 16 of FIG. 8 also produces the minimum and maximum tuning potentials at the points 11 and 12 as well as the effective temperature on these potentials which is required for temperature compensation of the tuning circuit. In addition, the arrangement 16 contains a decoupling circuit which lies between the wiper contact 13 of the tuning potentiometer 14 and the adjustment potentiometers 9 and 10.

The tuning circuit dealt with in the embodiments is developed for positive tuning potentials. In a similar manner, the tuning circuits of the invention may also be designed for negative tuning potentials.

It will be understood that the above description of the present invention is susceptible to various modification changes and adaptations.

What is claimed is:

1. A circuit for adjusting a tuning circuit, the tuning circuit including at least one resonant circuit composed of a variable inductance and a variable capacitance constituted by at least one voltage-variable tuning diode, one side of the resonant circuit being connected to a point at circuit ground potential and adjustment of the resonant circuit being effected by changing the resonant circuit inductance and the resonant circuit capacitance, with changing of the resonant circuit capacitance being effected exclusively by varying the tuning voltage of the tuning diode, the tuning circuit further including a source of a variable tuning potential which is variable over a range between maximum and minimum extreme values, each extreme value being different from the circuit ground potential, and said circuit for adjusting comprising at least one adjustment potentiometer connected between a point of said source providing the variable tuning potential and a point of said source permanently providing one of said extreme values, said potentiometer having an adjustable tap connected to provide the tuning voltage for said tuning diode.

2. An arrangement as defined in claim 1 wherein said tuning circuit includes a plurality of said resonant circuits and said circuit for adjusting comprises a plurality of said potentiometers connected together in parallel and each having a respective adjustable tap connected to provide the tuning voltage for at least one respective tuning diode.

3. An arrangement as defined in claim 1 wherein said source comprises a tuning potentiometer connected to have a respective one of the extreme values of the tuning potential at each of its ends and having an adjustable tap providing the variable tuning potential, and said adjustment potentiometer is connected between one end and said movable tap of said tuning potentiometer.

4. An arrangement as defined in claim 1 wherein said tuning circuit includes at least two of said resonant circuits and said adjustable tap of said adjustment potentiometer is connected to provide the tuning voltage for said at least two resonant circuits.

5. An arrangement as defined in claim 4 wherein said resonant circuits have respectively different relative frequency variations.

* * * * *